(12) United States Patent
Amm et al.

(10) Patent No.: US 7,423,431 B2
(45) Date of Patent: Sep. 9, 2008

(54) MULTIPLE RING POLEFACELESS PERMANENT MAGNET AND METHOD OF MAKING

(75) Inventors: Kathleen Melanie Amm, Clifton Park, NY (US); Evangelos Trifon Laskaris, Niskayuna, NY (US); Paul Shadforth Thompson, Stephentown, NY (US); Bulent Aksel, Clifton Park, NY (US); Bruce Campbell Amm, Clifton Park, NY (US); Michael Anthony Palmo, Jr, Ballston Spa, NY (US); Johannes Martinus Van Oort, Niskayuna, NY (US); Xianrui Huang, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 1063 days.

(21) Appl. No.: 10/672,658

(22) Filed: Sep. 29, 2003

(65) Prior Publication Data
US 2005/0068138 A1 Mar. 31, 2005

(51) Int. Cl.
*G01V 3/00* (2006.01)
*H01F 7/02* (2006.01)
(52) U.S. Cl. .................. 324/319; 324/320; 335/302
(58) Field of Classification Search ......... 324/300–322; 335/296–306
See application file for complete search history.

(56) References Cited
U.S. PATENT DOCUMENTS

| | | | |
|---|---|---|---|
| 3,899,762 A | 8/1975 | Studders |
| 4,496,395 A | 1/1985 | Croat |
| 4,540,453 A | 9/1985 | Boredelon |
| 4,667,123 A | 5/1987 | Denk |
| 4,672,346 A | 6/1987 | Miyamoto |
| 4,679,022 A | 7/1987 | Miyamoto |
| 4,741,094 A | 5/1988 | Denk |
| 4,777,464 A | 10/1988 | Takabatashi |
| 4,818,966 A | 4/1989 | Miyamoto |
| 4,827,235 A | 5/1989 | Inomata |
| 4,931,760 A | 6/1990 | Yamaguchi |
| 4,953,555 A | 9/1990 | Leupold |
| 4,998,976 A | 3/1991 | Rapoport |
| 5,063,934 A | 11/1991 | Rapoport |
| 5,229,723 A | 7/1993 | Sakurai |

(Continued)

FOREIGN PATENT DOCUMENTS

EP 0541653 5/1994

(Continued)

OTHER PUBLICATIONS

"Electrical Engineering Concepts and Applications," A. Bruce Carlson et al., Addison-Wesley Publishing Co., 1990, pp. 119-121.

(Continued)

*Primary Examiner*—Brij B. Shrivastav
*Assistant Examiner*—Dixomara Vargas
(74) *Attorney, Agent, or Firm*—Jason K. Klindtworth

(57) ABSTRACT

A permanent magnet assembly for an imaging apparatus having a permanent magnet body having a first surface and a stepped second surface which is adapted to face an imaging volume of the imaging apparatus, wherein the stepped second surface contains at least four steps.

13 Claims, 11 Drawing Sheets

U.S. PATENT DOCUMENTS

| | | | |
|---|---|---|---|
| 5,252,924 A | 10/1993 | Sakurai | |
| 5,283,544 A | 2/1994 | Sakurai | |
| 5,291,171 A | 3/1994 | Kobayashi | |
| 5,317,297 A | 5/1994 | Kaufman | |
| 5,320,103 A | 6/1994 | Rapoport | |
| 5,332,971 A | 7/1994 | Aubert | |
| 5,343,180 A | 8/1994 | Fukumoto | |
| 5,383,978 A | 1/1995 | Yamamoto | |
| 5,462,054 A | 10/1995 | Rapoport | |
| 5,570,073 A * | 10/1996 | Muller | 335/299 |
| 5,623,241 A | 4/1997 | Minkoff | |
| 5,631,616 A | 5/1997 | Ohta | |
| 5,680,086 A | 10/1997 | Allis | |
| 5,825,187 A | 10/1998 | Ohashi | |
| 5,942,962 A | 8/1999 | Gery | |
| 6,120,620 A | 9/2000 | Benz | |
| 6,130,538 A | 10/2000 | Carrozzi | |
| 6,147,578 A | 11/2000 | Panfil | |
| 6,150,911 A * | 11/2000 | Katznelson et al. | 335/299 |
| 6,157,278 A * | 12/2000 | Katznelson et al. | 335/296 |
| 6,157,281 A * | 12/2000 | Katznelson et al. | 335/306 |
| 6,163,154 A * | 12/2000 | Anderson et al. | 324/320 |
| 6,163,240 A * | 12/2000 | Zuk et al. | 335/299 |
| 6,191,584 B1 | 2/2001 | Trequattrini | |
| 6,198,286 B1 | 3/2001 | Trequattrini et al. | |
| 6,255,670 B1 | 7/2001 | Srivastava | |
| 6,259,252 B1 | 7/2001 | Laskaris | |
| 6,275,128 B1 | 8/2001 | Aoki | |
| 6,281,775 B1 | 8/2001 | Rapoport | |
| 6,311,383 B1 | 11/2001 | Umeda | |
| 6,333,630 B1 | 12/2001 | Holsinger | |
| 6,335,670 B1 * | 1/2002 | Kinanen | 335/296 |
| 6,404,197 B1 * | 6/2002 | Anderson et al. | 324/311 |
| 6,411,187 B1 * | 6/2002 | Rotem et al. | 335/296 |
| 6,429,761 B2 | 8/2002 | Laskaris | |
| 6,448,772 B1 | 9/2002 | Aoki | |
| 6,452,472 B1 | 9/2002 | Aoki | |
| 6,467,157 B1 | 10/2002 | Livni | |
| 6,489,872 B1 | 12/2002 | Fukushima | |
| 6,489,873 B1 | 12/2002 | Kruip | |
| 6,518,754 B1 | 2/2003 | Edwards | |
| 6,518,867 B2 * | 2/2003 | Laskaris et al. | 335/299 |
| 6,525,634 B2 * | 2/2003 | Laskaris et al. | 335/296 |
| 6,600,401 B2 * | 7/2003 | Zuk et al. | 335/299 |
| 6,670,877 B2 * | 12/2003 | Rapoport | 335/296 |
| 7,023,309 B2 * | 4/2006 | Laskaris et al. | 335/306 |
| 7,053,743 B2 * | 5/2006 | Laskaris et al. | 335/298 |
| 7,071,694 B1 * | 7/2006 | Kruip | 324/323 |
| 7,148,689 B2 * | 12/2006 | Huang et al. | 324/319 |
| 2002/0021129 A1 | 2/2002 | Laskaris | |
| 2002/0050895 A1 | 5/2002 | Zuk | |
| 2003/0011451 A1 | 1/2003 | Katznelson | |

FOREIGN PATENT DOCUMENTS

| | | |
|---|---|---|
| EP | 623939 | 11/1994 |
| EP | 0371775 | 3/1996 |
| EP | 526513 | 7/1996 |
| EP | 0541872 | 1/2000 |
| JP | 02141501 | 5/1990 |
| JP | 03170643 | 7/1991 |
| JP | 10174681 | 6/1998 |
| WO | 0048208 | 8/2000 |

OTHER PUBLICATIONS

"Magnetic Materials and Their Properties," E.A. Brandes et al., Smithells Metal Reference Book, Butterworth-Heinemann Ltd., 1992, p. 20-6.

"Permanent Magnet Assembly and Method of Making Thereof," Laskaris et al., U.S. Appl. No. 10/309,146, filed Dec. 4, 2002.

"Permanent Magnet Assembly and Method of Making Thereof," Laskaris et al., U.S. Appl. No. 10/309,139, filed Dec. 4, 2002.

"Permanent Magnet Assembly with Movable Permanent Body for Main Magnetic Field Adjustment," Huang et al.

* cited by examiner

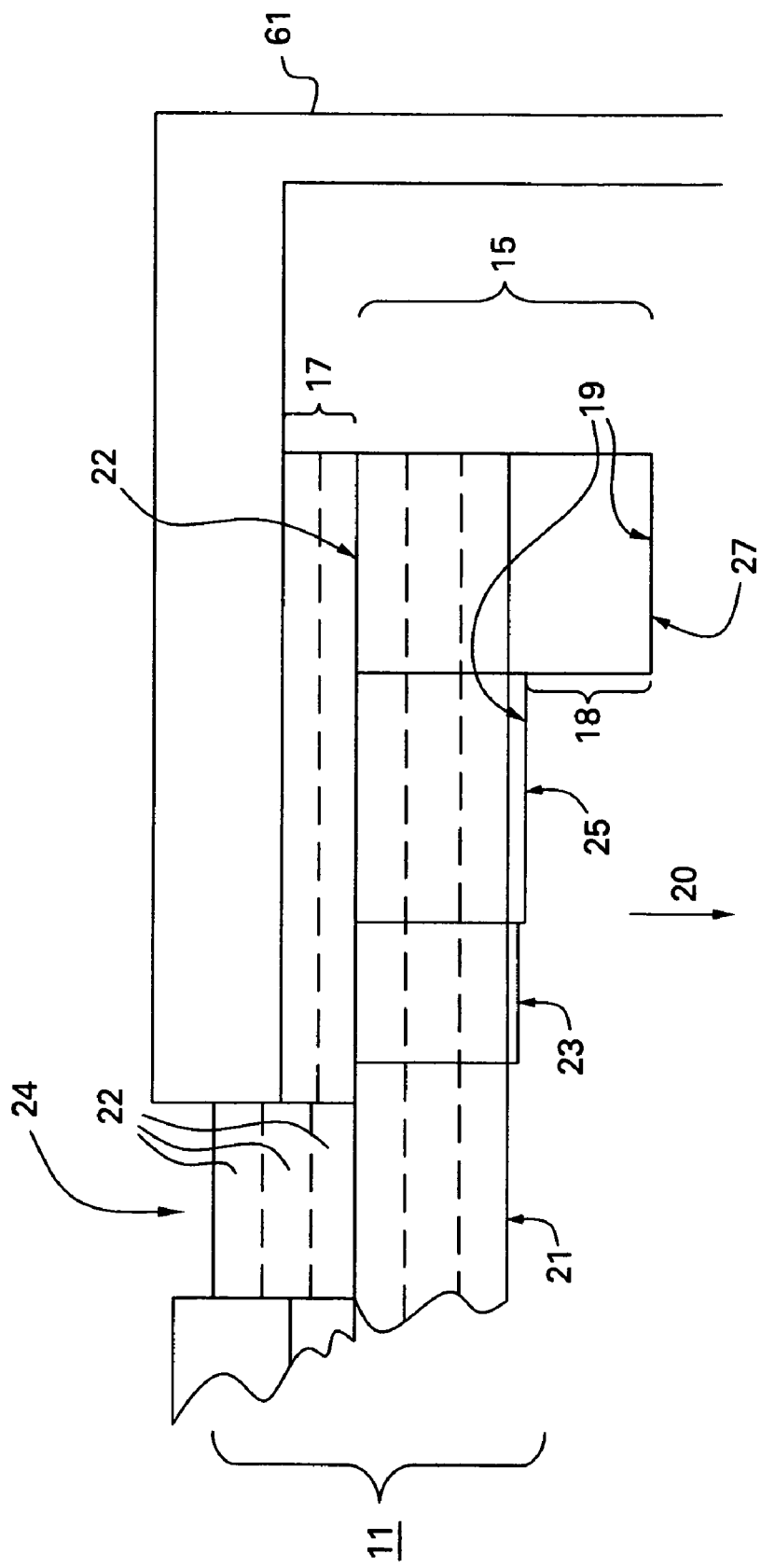

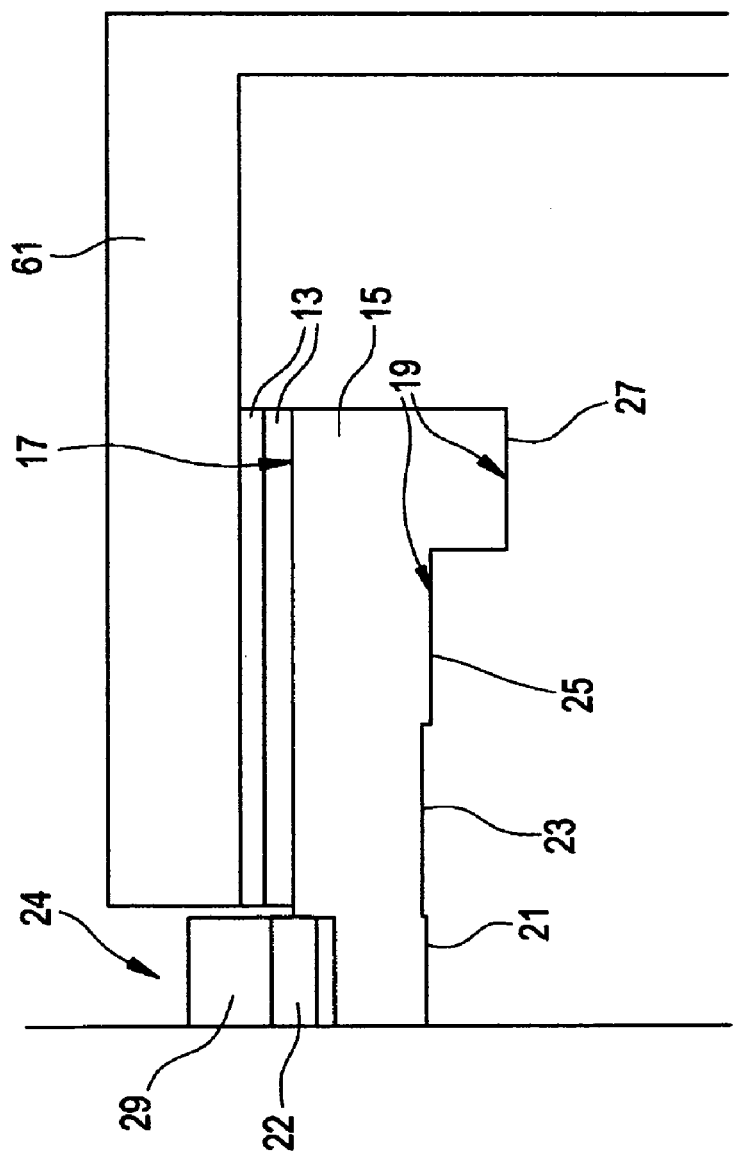

US 7,423,431 B2

MULTIPLE RING POLEFACELESS PERMANENT MAGNET AND METHOD OF MAKING

BACKGROUND OF THE INVENTION

The present invention is directed generally to permanent magnet assemblies and more particularly to permanent magnet assemblies for MRI systems.

There are various magnetic imaging systems which utilize permanent magnets. These systems include magnetic resonance imaging (MRI), magnetic resonance therapy (MRT) and nuclear magnetic resonance (NMR) systems. MRI systems are used to image a portion of a patient's body. MRT systems are generally smaller and are used to monitor the placement of a surgical instrument inside the patient's body. NMR systems are used to detect a signal from a material being imaged to determine the composition of the material.

These systems often utilize two or more permanent magnets directly attached to a support, frequently called a yoke. An imaging volume is providing between the magnets. A person or material is placed into an imaging volume and an image or signal is detected and then processed by a processor, such as a computer. The magnets are sometimes arranged in an assembly 1 of concentric rings of permanent magnet material, as shown in FIG. 1. For example, there may be two rings 3, 5 separated by a ring of non-magnetic material 7 in the gap between the magnet rings 3, 5. The ring of non-magnetic material 7 extends all the way through the magnet assembly 1 parallel to the direction of the magnetic field. The assembly 1 also contains a hole 9 adapted to receive a bolt which will fasten the assembly 1 to the yoke.

The prior art imaging systems also contains pole pieces and gradient coils adjacent to the imaging surface of the permanent magnets facing the imaging volume. The pole pieces are required to shape the magnetic field and to decrease or eliminate undesirable eddy currents which are created in the yoke and the imaging surface of the permanent magnets.

However, the pole pieces also interfere with the magnetic field generated by the permanent magnets. Thus, the pole pieces decrease the magnitude of the magnetic field generated by the permanent magnets that reaches the imaging volume. Thus, a larger amount of permanent magnets are required to generate a magnetic field of an acceptable strength in the imaging volume, especially in an MRI system, due to the presence of the pole pieces. The larger amount of the permanent magnets increases the cost of the magnets and increases the complexity of manufacture of the imaging systems, since the larger magnets are bulky and heavy.

BRIEF SUMMARY OF THE INVENTION

A preferred embodiment of the present invention provides a permanent magnet assembly for an imaging apparatus comprising a permanent magnet body having a first surface and a stepped second surface which is adapted to face an imaging volume of the imaging apparatus, wherein the stepped second surface contains at least four steps.

Another preferred embodiment of the present invention provides a permanent magnet assembly for an imaging apparatus, comprising at least one layer of a soft magnetic material and a permanent magnet body. The permanent magnet body comprises a cylindrical base section having a major first surface attached to the at least one layer of a soft magnetic material and a major second surface opposite to the major first surface of the base section, and a hollow ring section having a major first surface and a major second surface. The major first surface of the hollow ring section is attached to an outer portion of the major second surface of the base section. The major second surface of the hollow ring section extends at least 0.05 meters above an adjacent portion of the major second surface of the base section to form a pocket.

Another preferred embodiment of the present invention provides a method of making a permanent magnet assembly, comprising forming at least two layers of blocks of unmagnetized material, attaching the at least two layers of blocks to each other to form a base section of a first precursor body, the base section having a first major surface and an opposite second major surface, such that the thickness of the at least two layers of blocks is substantially perpendicular to the first and the second major surfaces and shaping the second major surface of the base section to form at least three steps in the second major surface. The method also comprises forming a hollow ring section of the first precursor body comprising a plurality of blocks of unmagnetized material, attaching the hollow ring section to the second major surface of the base section to form the first precursor body, and magnetizing the first precursor body to form a first permanent magnet body.

Another preferred embodiment of the present invention provides a permanent magnet assembly for an imaging apparatus comprising a permanent magnet body having a first surface and a stepped second surface which is adapted to face an imaging volume of the imaging apparatus, wherein a central step of the stepped second surface comprises a protrusion.

BRIEF DESCRIPTION OF THE DRAWINGS

FIGS. 2A and 2B are side cross sectional views of a right half of permanent magnet assemblies according to the first preferred embodiment of the present invention.

DETAILED DESCRIPTION OF THE INVENTION

Figure 1:
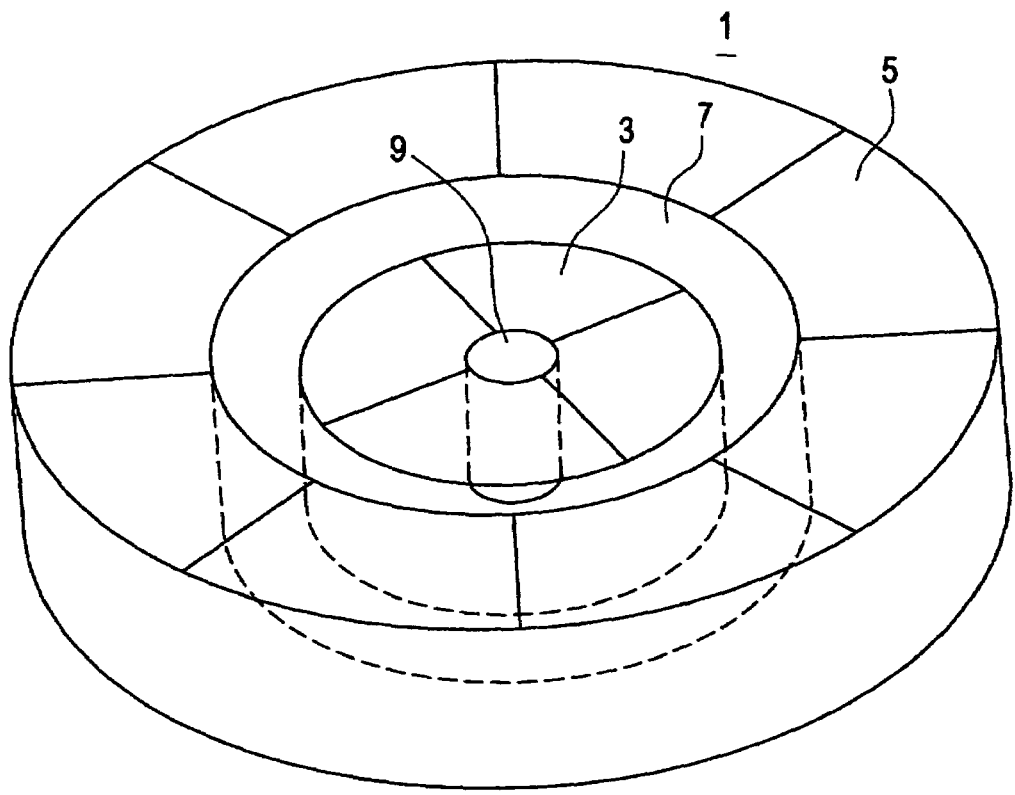
FIG. 1 is a perspective view of a prior art magnet assembly.

The present inventors have discovered that a permanent magnet assembly which has a stepped imaging surface having four or more steps and which has a pocket having a depth of at least 0.05 meters filled with metal shims provides an easily shimmed permanent magnet design. Preferably, a hollow ring permanent magnet section of the assembly having a height of at least 0.05 meters forms the rim of the pocket and is assembled separately from a base section of the assembly. The hollow ring section is then attached to the base section of the assembly. The base section may have two or more steps, such as three steps, machined in the exposed portion the imaging surface of the base section.

Thus, a permanent magnet assembly for an imaging apparatus comprises a permanent magnet body having a first surface and a stepped second imaging surface which is adapted to face an imaging volume of the imaging apparatus. The stepped second surface contains at least four steps. The stepped second surface imaging of the permanent magnet body comprises a major surface of the hollow ring section and a portion of the imaging surface of the base section that is not covered by the ring section.

FIG. 2A illustrates a side cross sectional view of a right half of a magnet assembly 11 for an imaging apparatus according to a first preferred embodiment of the present invention. The left half of the assembly 11 is a mirror image of the right half and is not shown for clarity. The magnet assembly contains at least one layer of soft magnetic material 13 and a permanent magnet body 15, which contains a first surface 17 and a second surface 19. The first and the second surfaces are substantially parallel to the x-y plane, to which the direction of the magnetic field (i.e., the z-direction) is normal. The direction of the magnetic field (i.e., the z-axis direction) is schematically illustrated by the arrow 20 in FIG. 2A. The first surface 17 is attached over the at least one layer of the soft magnetic material 13. The second or imaging surface 19 is adapted to face an imaging volume of the imaging apparatus.

In one preferred aspect of the present invention, a first material of the first body 15 comprises a magnetized permanent magnet material. The first material may comprise any permanent magnet material or alloy, such as CoSm, NdFe or RMB, where R comprises at least one rare earth element and M comprises at least one transition metal, for example Fe, Co, or Fe and Co.

Preferably, the first material comprises the RMB material, where R comprises at least one rare earth element and M comprises at least one transition metal, such as at least 50 atomic percent iron. Most preferred, the first material comprises a praseodymium (Pr) rich RMB alloy as disclosed in U.S. Pat. No. 6,120,620, incorporated herein by reference in its entirety. The praseodymium (Pr) rich RMB alloy comprises about 13 to about 49 atomic percent rare earth elements, where the rare earth content consists essentially of greater than 50 percent praseodymium, an effective amount of a light rare earth elements selected from the group consisting of cerium, lanthanum, yttrium and mixtures thereof, and balance neodymium; about 4 to about 20 atomic percent boron; and balance iron with or without impurities. As used herein, the phrase "praseodymium-rich" means that the rare earth content of the iron-boron-rare earth alloy contains greater than 50% praseodymium. In another preferred aspect of the invention, the percent praseodymium of the rare earth content is at least 70% and can be up to 100% depending on the effective amount of light rare earth elements present in the total rare earth content. An effective amount of a light rare earth elements is an amount present in the total rare earth content of the magnetized iron-boron-rare earth alloy that allows the magnetic properties to perform equal to or greater than 29 MGOe $(BH)_{max}$ and 6 kOe intrinsic coercivity (Hci). In addition to iron, M may comprise other elements, such as, but not limited to, titanium, nickel, bismuth, cobalt, vanadium, niobium, tantalum, chromium, molybdenum, tungsten, manganese, aluminum, germanium, tin, zirconium, hafnium, and mixtures thereof. Thus, the first material most preferably comprises 13-19 atomic percent R, 4-20 atomic percent B and the balance M, where R comprises 50 atomic percent Or greater Pr, 0.1-10 atomic percent of at least one of Ce, Y and La, and the balance Nd.

The at least one layer of a soft magnetic material 13 may comprise one or more layers of any soft magnetic material. A soft magnetic material is a material which exhibits macroscopic ferromagnetism only in the presence of an applied external magnetic field. Preferably, the assembly 11 contains a laminate of a plurality of layers of soft magnetic material 13, such as 2-40 layers, preferably 10-20 layers. The possibility of the presence of plural layers is indicated by the dashed lines in FIG. 2A. The individual layers are preferably laminated in a direction substantially parallel to the direction of the magnetic field emitted by the permanent magnet(s) of the assembly (i.e., the thickness of the soft magnetic layers is parallel to the magnetic field direction). However, if desired, the layers may be laminated in any other direction, such as at any angle extending from parallel to perpendicular to the magnetic field direction. The soft magnetic material may comprise any one or more of Fe—Si, Fe—Co, Fe—Ni, Fe—Al, Fe—Al—Si, Fe—Co—V, Fe—Cr—Ni and amorphous Fe- or Co-base alloys.

The magnet assembly 11 may have any shape or configuration. For example, the assembly 11 may have a width or outside diameter of about 40 cm to about 90 cm (i.e., about 0.4 to about 0.9 meters). Preferably, the second surface 19 that is adapted to face an imaging volume of the imaging apparatus is shaped to optimize the shape, strength and uniformity of the magnetic field. The optimum shape of the body 15 and its second surface 19 may be determined by a computer simulation, based on the size of the imaging volume, the strength of the magnetic field of the permanent magnet(s), shim design or shimmability and other design consideration. For example, the simulation may comprise a finite element analysis method. In a preferred aspect of the present invention, the second surface 19 has a circular cross section which contains a plurality of concentric rings 21, 23, 25, 27 that extend to different heights respective to one another, as shown in FIG. 2A. In other words, the surface 19 is stepped, and contains at least four steps 21, 23, 25 and 27. Most preferably, the heights of the rings 21, 23, 25, 27 decrease from the outermost ring 27 to the inner most or central ring 21, as shown in FIG. 2A. However, there may be two, three or more than four rings, and a height of any inner ring may be greater than a height of any outer ring, as shown in FIG. 2B and as described in more detail below, depending on the system configuration and the materials involved.

Preferably, the height 18 of ring 27 from step 25 to surface 19 is at least 0.05 meters, such as between 0.05 and 0.075 meters, preferably about 0.0625 meters, to form a pocket that is filled with shims. The height of rings 23 and 25 shown in FIG. 2A is preferably less than 0.03 meters, such as 0.1 to 20 millimeters. In other words, the imaging surface of each of the rings 21, 23, 25 extends less than 0.03 meters from an imaging surface of an adjacent, inner ring. Thus, in a preferred aspect of the present invention, the outer ring 27 has a height of at least 0.05 meters, while each inner ring 23, 25 of the assembly has a height that the less than 0.03 meters. Preferably, at least two of the inner rings 21, 23 are machined into one section of the permanent magnet body 15, while the outer ring 27 comprises another section of the permanent magnet body which is made separately and attached to the first section containing the inner rings.

In another preferred aspect of the first embodiment illustrated in FIG. 2B, the height of the first central (i.e., the inner most) solid ring 21 is greater than a height of an adjacent hollow ring 23 surrounding the first central solid ring 21. The central ring 21 forms a protrusion in the imaging surface 19 of the assembly. Thus, the first inner hollow ring 23 located next to the central ring 21 has the smallest height of all the rings in the assembly 11. Preferably, the central ring 21 has a height that is less than the height of the third hollow ring 25 which surrounds the second ring 23 and less than the higher of the outer hollow ring 27. Preferably, the height 18 of ring 27 from step 25 to surface 19 is at least 0.05 meters, such as between 0.05 and 0.075 meters, preferably about 0.0625 meters, to form a pocket that is filled with shims. The height of rings 21 and 25 shown in FIG. 2B is preferably less than 0.03 meters, such as 0.1 to 20 millimeters.

Preferably, the assembly contains any suitable movable permanent magnet body which is movable with respect to the imaging surface of stationary permanent magnet body 15. The movable body may be located between the imaging system support 61 and the stationary permanent magnet body 15. For example, movable permanent magnet body may comprise removable permanent magnet pieces 22 located in an opening 24 extending through the at least one layer of soft magnetic material 13 and support 61, as illustrated in FIGS. 2A and 2B. Alternatively, the movable permanent magnet body may comprise a movable permanent magnet plug 26 located in an opening 24, as illustrated in FIG. 3.

For example, the permanent magnet pieces 22 may comprise permanent magnet bars or other shaped pieces which are manually or mechanically placed on the back side 17 of the permanent magnet body 15 through the opening 24 in the at least one layer of soft magnetic material 13, as shown in FIGS. 2A and 2B. Thus, a specific number of pieces 22 of positive and/or negative magnetization may be placed or removed from the assembly 11 to optimize the imaging system performance for a given set of conditions, such as to adjust the $B_o$ field of the assembly 11 to maintain this field within the desired value ranges. The pieces 22 are located in the opening 24 in the imaging apparatus support or yoke 61 and on the back surface 17 of the stationary permanent magnet body 15. If desired, a metal backing 29, such as an iron backing, may be inserted between the yoke 61 and the permanent magnet pieces 22.

Figure 3:
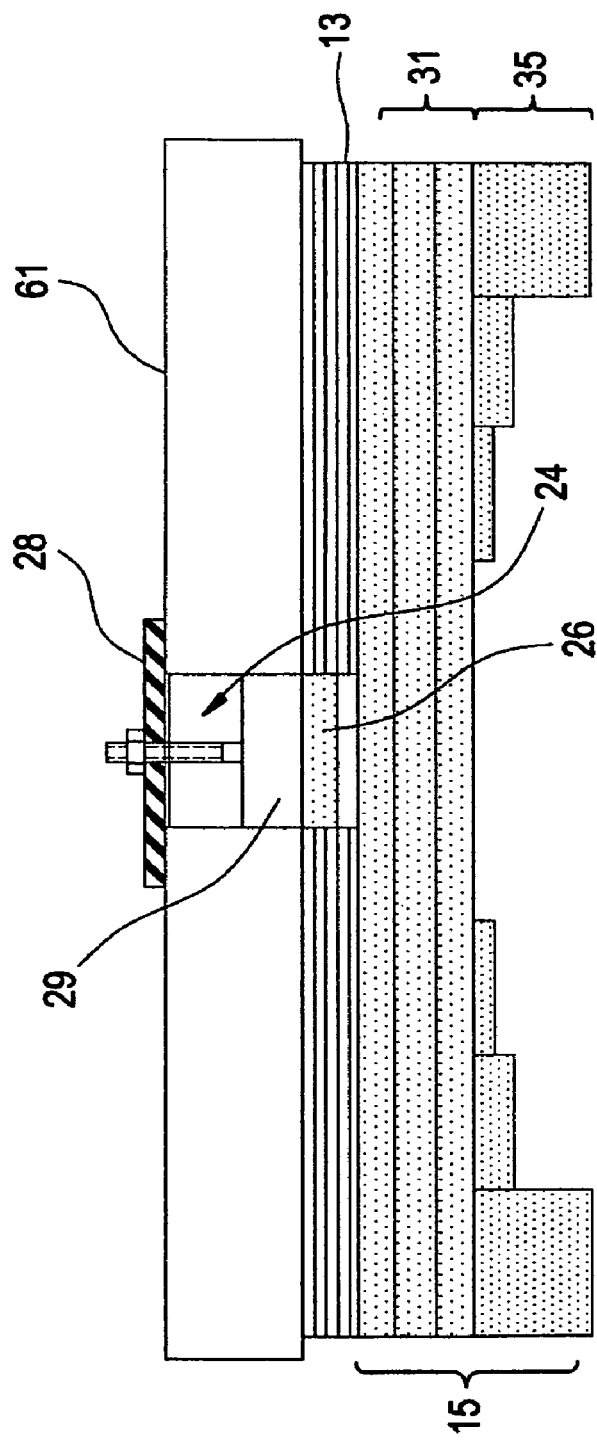
FIG. 3 is a perspective view of a permanent magnet assembly having a permanent magnet plug.

Alternatively, a movable permanent magnet plug 26 is located in the opening 24, as shown in FIG. 3. The permanent magnet plug 26 may be moved up and down in the opening 24 (i.e., along the axis of the opening) by any suitable actuator 28 which is adapted to move the movable permanent magnet plug. For example, the actuator 28 may be any suitable mechanical or electromechanical device, such as a pulley or a rail, which is manually or mechanically actuated to move the plug 26. A metal backing 29, such as an iron backing may be inserted between the actuator 28 and the plug 26. If desired, the plug 26 may be removed from the assembly 11 under certain conditions, if desired.

The movable permanent magnet body 22, 26 may comprise the same or different permanent magnet material as the stationary permanent magnet body 15. The permanent magnet movable body may have a positive or negative magnetization compared to the magnetization of the permanent magnet body 15. The permanent magnet movable body is moved with respect to the stationary permanent magnet body 15 to adjust the $B_o$ field of the magnet assembly to maintain this field within the desired value ranges. If desired, the opening 24 for the movable permanent magnet body 22, 26 may from the back side 17 into the permanent magnet body 15, as shown in FIG. 2B. Thus, the movable magnet body 22, 26 may be moved in and out of the opening 24 to fill and expose, respectively, the end portion of the opening 24 located in the permanent magnet body 15. Preferably, the opening 24 extends only part of the way through the permanent magnet body 15.

In a second preferred embodiment of the present invention, the stationary permanent magnet body 15 comprises at least two sections. Preferably, these sections are laminated in a direction perpendicular to the direction of the magnetic field (i.e., the thickness of the sections is parallel to the magnetic field direction). Most preferably, each section is made of a plurality of square, hexagonal, trapezoidal, annular sector or other shaped blocks adhered together by an adhesive substance. An annular sector is a trapezoid that has a concave top or short side and a convex bottom or long side.

Figure 4:
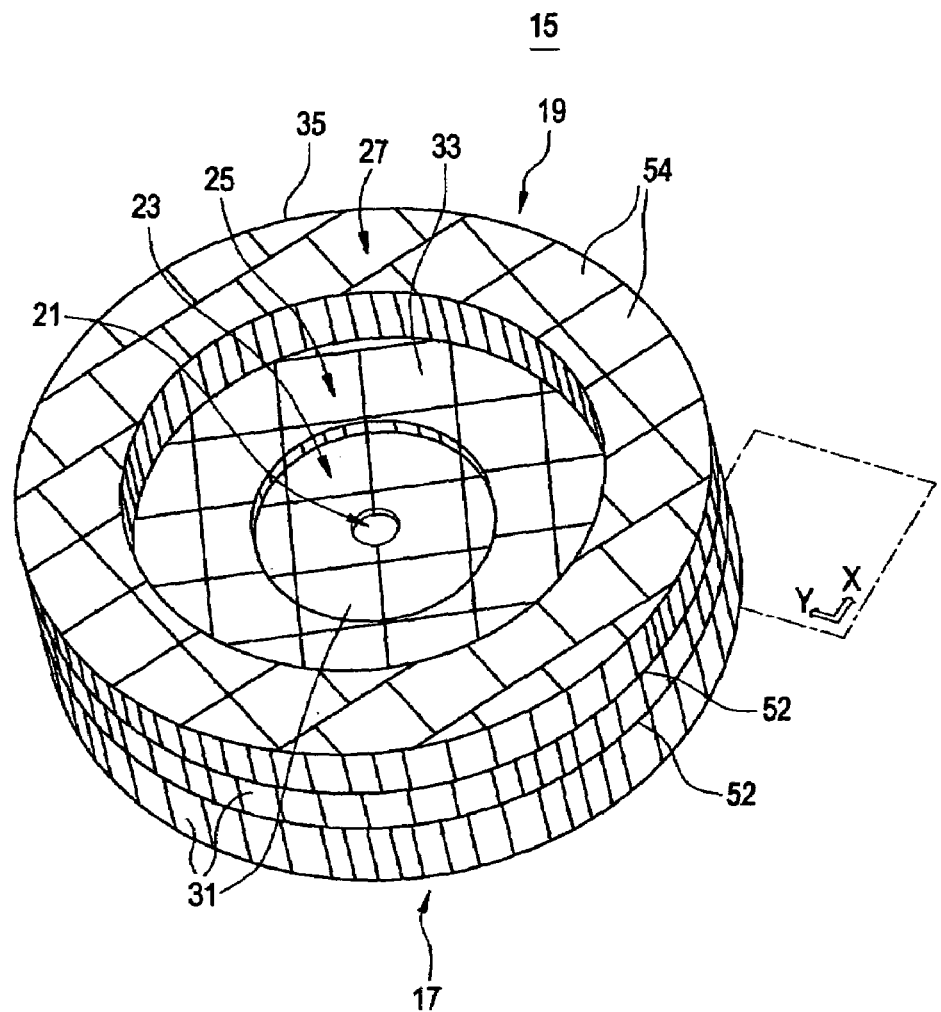
FIG. 4 is a perspective view of a permanent magnet body according to the second preferred embodiment of the present invention.
Figure 5:
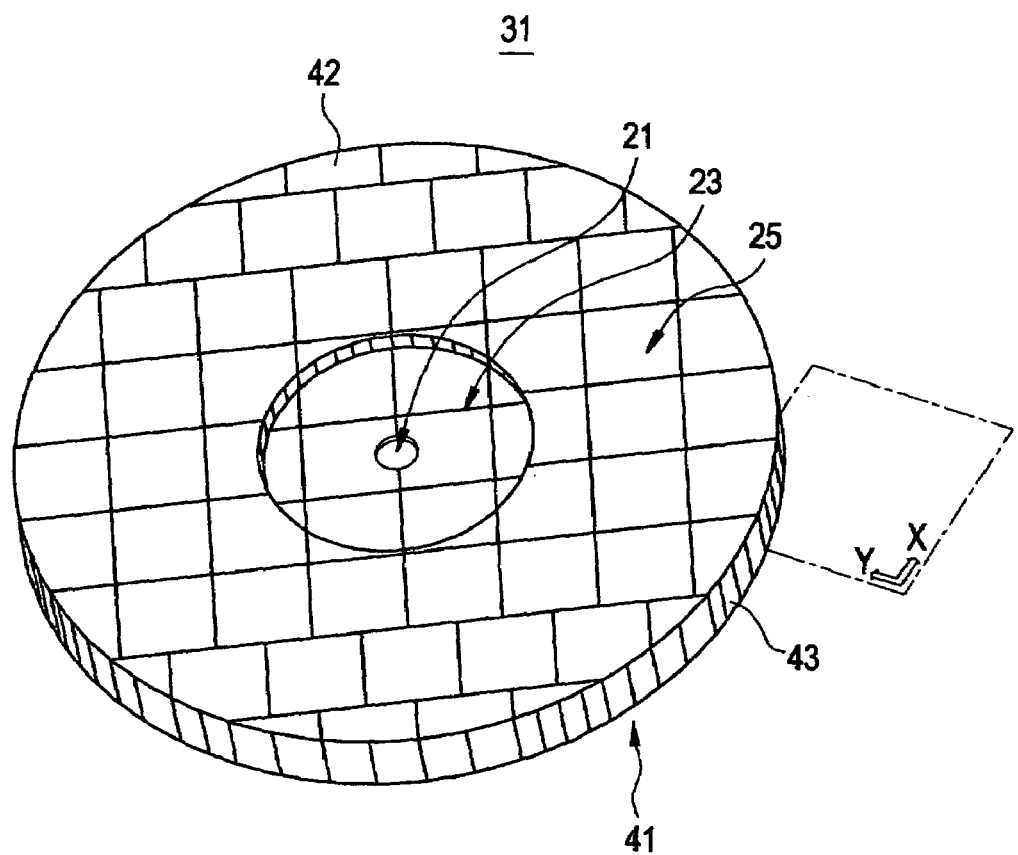
FIG. 5 is a perspective view of a base section of the body of FIG. 4.
Figure 6:
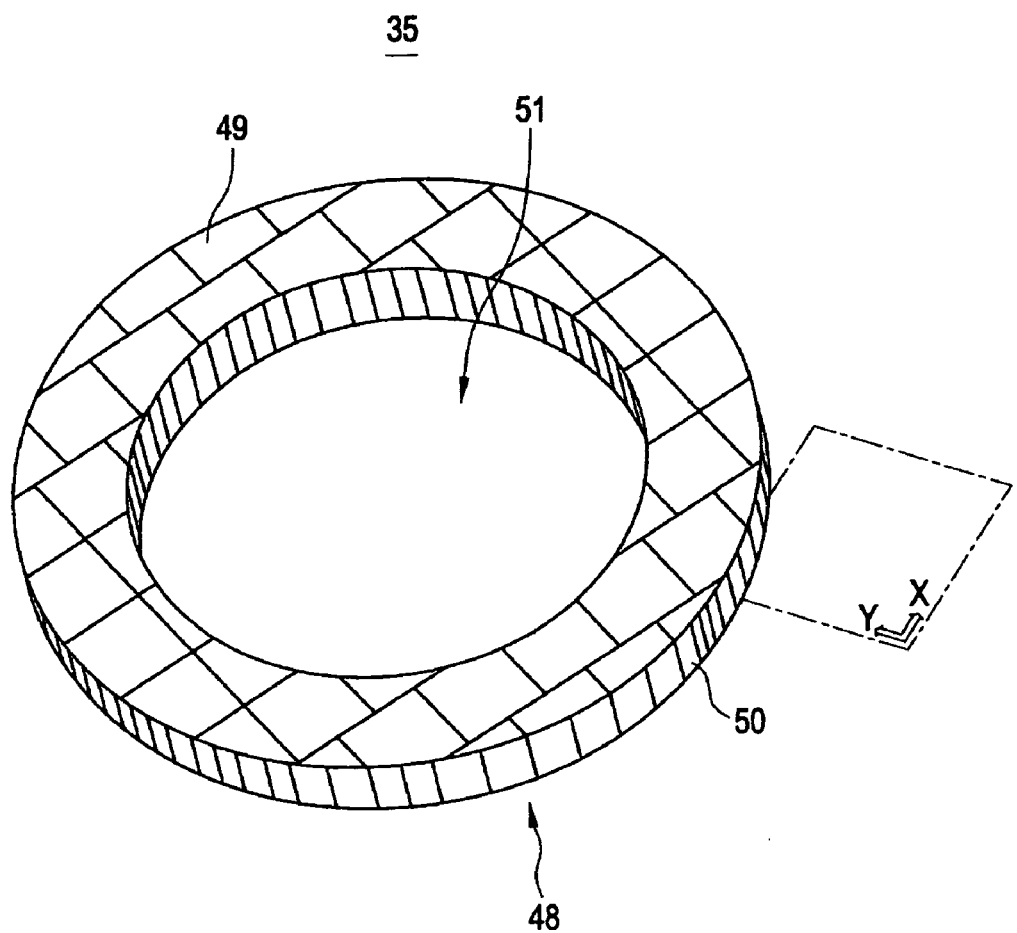
FIG. 6 is a perspective view of a hollow ring section of the body of FIG. 4.

One preferred configuration of the body 15 is shown in FIG. 4. The body 15 comprises a permanent magnet base section or body 31, as shown in FIG. 5, and a permanent magnet hollow ring section or body 35, as shown in FIG. 6. A pocket 33 filled with shims is formed by the steps in the imaging surface 19 of the body 15.

The base section 31 preferably has a cylindrical configuration, as shown in FIG. 5. The first 41 and second 42 major surfaces of the base section 31 are the "bottom" and "top" surfaces of the cylinder (i.e., the bases of the cylinder). The major surfaces 41, 42 have a larger diameter than the height of the edge surface 43 of the cylinder 31. Preferably, but not necessarily, the first or back surface 41 is flat. The first surface 41 corresponds to the first surface 17 that is adapted to be attached to the at least one layer of soft magnetic material 13, as shown in FIGS. 2A and 2B.

The second surface 42 is stepped, and preferably has at least three steps 21, 23 and 25. At least two of the steps, such as the inner steps 21 and 23, in the second surface 42 of the base section 31 are machined into the second surface 42. The outer step 25 may comprise the original surface of the base section 31, if desired. The inner portion of second surface 42, such as steps 21 and 23 and the inner portion of step 25, comprises the inner portion of the imaging surface 19 of the permanent magnet assembly 11. As described above, the inner steps 23, 25 preferably have a height that is less than 0.03 meters. If desired, the inner most or central step 21 may comprise a protrusion, as shown in FIG. 2B, rather than a recess, as shown in FIGS. 4 and 5.

The hollow ring section 35 is attached to an outer portion of second surface 42 of the base section 31. The hollow ring section 35 also has a cylindrical configuration, with the first 48 and a second 49 major surfaces being base surfaces of the ring cylinder 35, as shown in FIG. 6. The major surfaces 48, 49 have a larger diameter than a height of the edge surface 50 of the ring section. The hollow ring section 35 has a circular opening 51 extending from the first 48 to the second 49 base surface, parallel to the direction of the magnetic field 20. The hollow ring section 35 is formed over the second major surface 42 of the base section 31, such that the steps or rings 21, 23 and 25 are exposed through the opening 51. The first major surface 48 of the section 35 is attached to the second surface 42 of the section 31, while the second major surface 49 of the section 35 comprises an outer portion of the imaging surface 19 of the permanent magnet assembly 11. Thus, the first and second surfaces of the base section and the first and second surfaces of the hollow ring section are arranged substantially perpendicular to a direction of a magnetic field of the magnet assembly.

Preferably, the second surface 49 of the ring section 35 extends at least 0.05 meters, such as between about 0.05 and about 0.075 meters above an outer step 25 on the second surface 42 of the base body 31. The width (i.e., the difference between the internal and external diameter) of the ring section 35 is preferably at least 0.05 meters, such as about 0.1 to about 0.5 meters, preferably about 0.25 to about 0.3 meters. In other words, the height and width of the ring section 35 is preferably at least 0.05 meters. The inner diameter of the ring section 35 forms a pocket 33. The pocket 33 is filled with metal shims. Preferably, the shims are made of non-permanent magnet material, such as iron and other suitable metals and alloys.

The sections 31 and 35 of the permanent magnet body 15 may be attached to each other and to the soft magnetic material layer(s) 13 by any appropriate means, such as adhesive layers, brackets and/or bolt(s). Preferably, a layer 52 of adhesive substance, such as epoxy or glue is provided between the second surface 42 of the base section 31 and the first surface 48 of the hollow ring body 35.

Preferably, the cylindrical base body 31 and the hollow ring body 35 comprise a plurality of square, hexagonal, trapezoidal or annular sector shaped blocks 54 of permanent magnet material adhered together by an adhesive substance, such as epoxy. However, the bodies 31 and 35 may comprise unitary bodies instead of being made up of individual blocks. Preferably, the base section 31 comprises at least two layers of permanent magnet blocks 54. For example, the base section 31 may comprise three layers of permanent magnet blocks 54 as shown in FIG. 2A.

The magnet assembly 11 of the preferred embodiments of the present invention is preferably used in an imaging system, such as an MRI, MRT or an NMR system. Most preferably, at least two magnet assemblies of the preferred embodiments are used in an MRI system. The magnet assemblies are attached to a yoke or a support in an MRI system.

Figure 7:
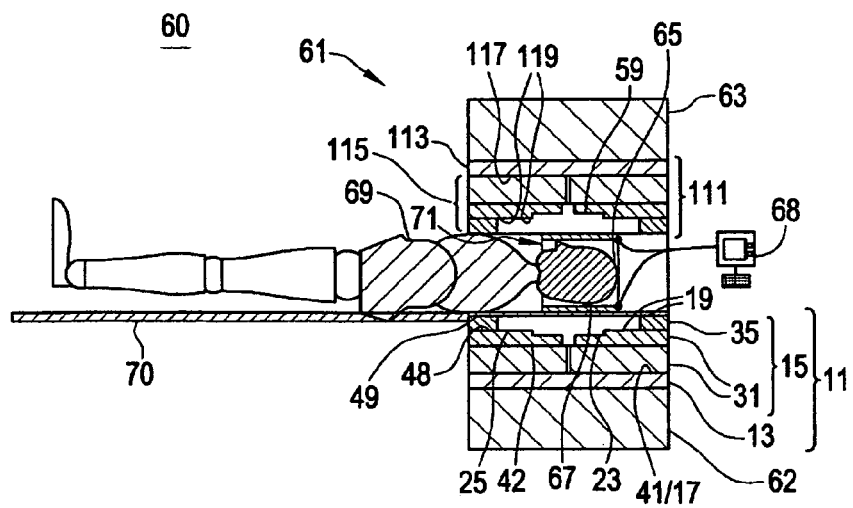
FIG. 7 is a side cross sectional view of an MRI system containing a permanent magnet assembly according the preferred embodiments of the present invention.

Any appropriately shaped yoke may be used to support the magnet assemblies. For example, a yoke generally contains a first portion, a second portion and at least one third portion connecting the first and the second portion, such that an imaging volume is formed between the first and the second portion. FIG. 7 illustrates a side cross sectional view of an MRI system 60 according to one preferred aspect of the present invention. The system contains a yoke 61 having a bottom portion or plate 62 which supports the first magnet assembly 11 and a top portion or plate 63 which supports the second magnet assembly 111. It should be understood that "top" and "bottom" are relative terms, since the MRI system 60 may be turned on its side, such that the yoke contains left and right portions rather than top and bottom portions. The imaging volume is 65 is located between the magnet assemblies.

As described above, the first magnet assembly 11 comprises at least one permanent magnet body 15 containing an imaging (i.e., second) surface 19 exposed to the imaging volume 65 and at least one soft magnetic material layer 13 between a back (i.e., first) surface 17 of the at least one permanent magnet 15 and the first yoke portion 62. The second magnet assembly 111 is preferably identical to the first assembly 11. The second magnet assembly 111 comprises at least one permanent magnet body 115 containing an imaging (i.e., second) surface 119 exposed to the imaging volume 65 and at least one soft magnetic material layer 113 between a back (i.e., first) surface 117 of the at least one permanent magnet 115 and the second yoke portion 63. The minimum height of imaging volume 65 between surfaces 19 and 119 is preferably about 0.2 to about 0.6 meters.

The MRI system 60 is preferably operated without pole pieces formed between the imaging surfaces 19, 119 of the permanent magnets 15, 115 of the first 11 and second 111 magnet assemblies and the imaging volume 65. However, if desired, very thin pole pieces may be added to further reduce or eliminate the occurrence of eddy currents. The MRI system further contains conventional electronic components, such as an optional gradient coil, an rf coil 67 and an image processor 68, such as a computer, which converts the data/signal from the rf coil 67 into an image and optionally stores, transmits and/or displays the image. If desired, the gradient coil may be omitted. These elements are schematically illustrated in FIG. 7.

FIG. 7 further illustrates various optional features of the MRI system 60. For example, the system 60 may optionally contain a bed or a patient support 70 which supports the patient 69 whose body is being imaged. The system 60 may also optionally contain a restraint 71 which rigidly holds a portion of the patient's body, such as a head, arm or leg, to prevent the patient 69 from moving the body part being imaged. The magnet assemblies 11, 111 may be are attached to the yoke 61 by bolts or by other means, such as by brackets and/or by glue.

The system 60 may have any desired dimensions. The dimensions of each portion of the system are selected based on the desired magnetic field strength, the type of materials used in constructing the yoke 61 and the assemblies 11, 111 and other design factors.

Figure 8:
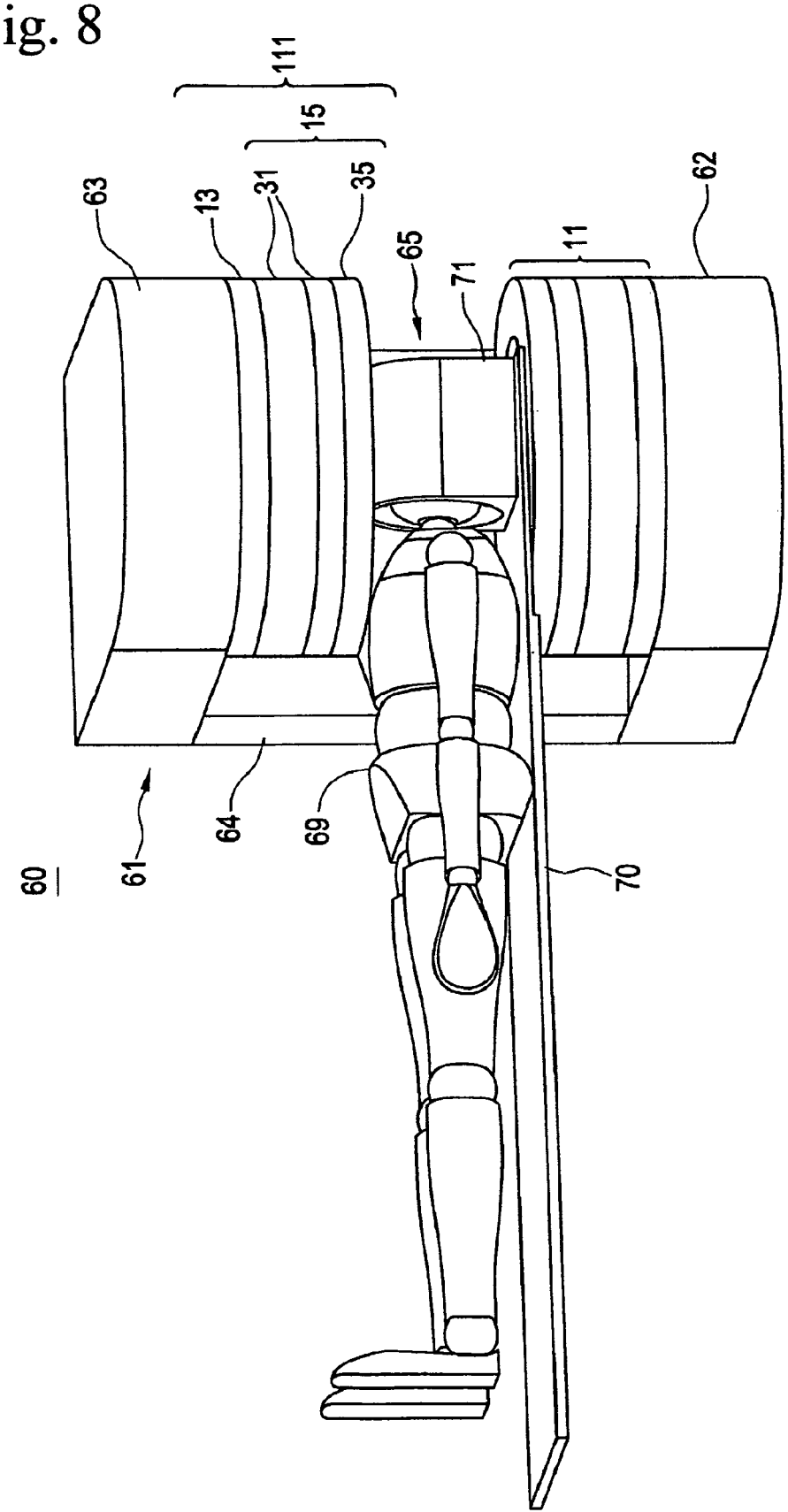
FIG. 8 is a perspective view of an MRI system containing a "C" shaped yoke.

In one preferred aspect of the present invention, the MRI system 60 contains only one third portion 64 connecting the first 62 and the second 63 portions of the yoke 61. For example, the yoke 61 may have a "C" shaped configuration, as shown in FIG. 8. The "C" shaped yoke 61 has one straight or curved connecting bar or column 64 which connects the bottom 62 and top yoke 63 portions.

Figure 9:
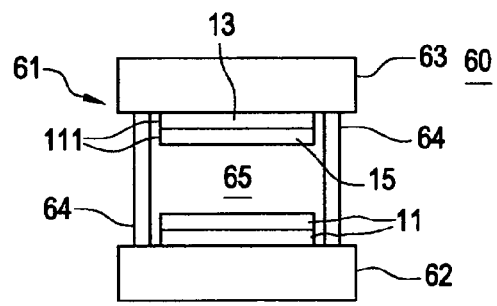
FIG. 9 is a side cross sectional view of an MRI system containing a yoke having a plurality of connecting bars.

In another preferred aspect of the present invention, the MRI system 60 has a different yoke 61 configuration, which contains a plurality of connecting bars or columns 64, as shown in FIG. 9. For example, two, three, four or more connecting bars or columns 64 may connect the yoke portions 62 and 63 which support the magnet assemblies 11, 111.

Figure 10:
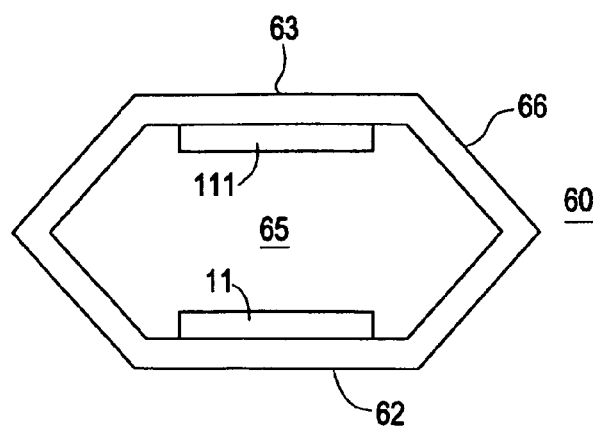
FIG. 10 is a side cross sectional view of an MRI system containing a tubular yoke.

In yet another preferred aspect of the present invention, the yoke 61 comprises a unitary tubular body 66 having a circular or polygonal cross section, such as a hexagonal cross section, as shown in FIG. 10. The first magnet assembly 11 is attached to a first portion 62 of the inner wall of the tubular body 66, while the second magnet assembly 111 is attached to the opposite portion 63 of the inner wall of the tubular body 66 of the yoke 61. If desired, there may be more than two magnet assemblies in attached to the yoke 61. The imaging volume 65 is located in the hollow central portion of the tubular body 66.

The imaging apparatus, such as the MRI 60 containing the permanent magnet assembly 11, is then used to image a portion of a patient's body using magnetic resonance imaging. A patient 69 enters the imaging volume 65 of the MRI system 60, as shown in FIGS. 7 and 8. A signal from a portion of a patient's 69 body located in the volume 65 is detected by the rf coil 67, and the detected signal is processed by using the processor 68, such as a computer. The processing includes converting the data/signal from the rf coil 67 into an image, and optionally storing, transmitting and/or displaying the image.

The method of making the precursor body of unmagnetized material according to the third preferred embodiment will now be described. While a method of making the body 15 having a configuration illustrated in FIG. 4 will be described for convenience, it should be understood that the precursor body 15 may have any desired configuration and may be made by any desired method.

Figure 12:
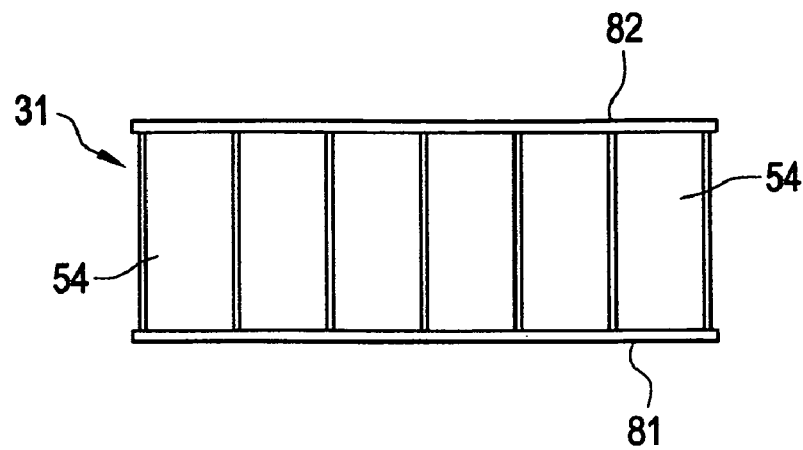
FIGS. 12-14 are side cross sectional views of a method of making a permanent magnet body.

According to the method of the fourth preferred embodiment, a plurality of blocks 54 of unmagnetized material are placed on a support 81, as shown in FIG. 12. Preferably, the unmagnetized material comprises the RMB alloy and the blocks 54 have the same composition. Preferably, the support 81 comprises a non-magnetic metal sheet or tray, such as a flat, 1/16 inch aluminum sheet coated with a temporary adhesive. However, any other support may be used. A cover 82, such as a second aluminum sheet covered with a temporary adhesive is placed over the blocks 54.

Figure 13:
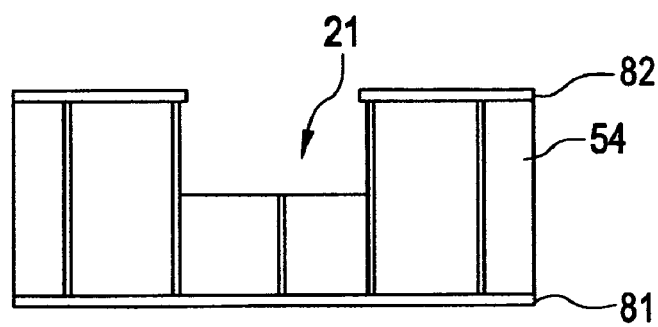

Preferably, at least two layers of blocks 54 are stacked. For example, three layers of blocks may be stacked to form the base section 31 of the stationary permanent magnet body 15. The blocks 54 are then shaped to form a first precursor body prior to removing the cover 82 and the support 81, as shown in FIG. 13. For example, the first precursor body may comprise the base body 31, as shown in FIG. 5.

Alternatively, the cover 82 may be removed prior to shaping the blocks. In this case, a second layer of blocks 54 is formed on and adhered to a first layer of blocks 54. Another cover is then placed over the second layer of blocks and the second layer of blocks may be shaped before removing the cover to form at least one step in the second layer of blocks. These steps may be repeated to form as many layers of blocks as desired. The upper surface of the last layer of blocks is then shaped to form the stepped surface.

The blocks may be shaped by any desired method, such as by a water jet. For example, the water jet cuts the rectangular assembly of blocks 54 into a cylindrical or ring shaped section 31, 35 (section 31 is shown in FIG. 13 for example). Preferably, the water jet cuts through the support 81 and cover 82 sheets during the shaping of the assembly of the blocks 54.

Figure 14:
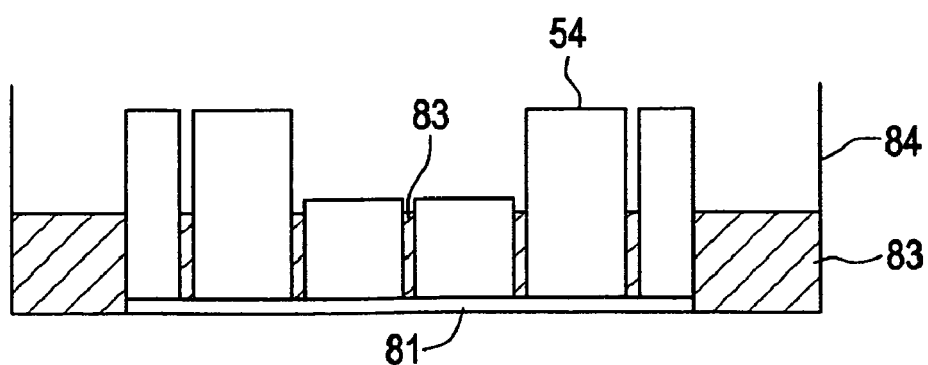

The cover sheet 82 is then removed and an adhesive material 83 is then provided to adhere the blocks 54 to each other, as shown in FIG. 14. For example, the shaped blocks 54 attached to the support sheet 81 are placed into an epoxy pan 84, and an epoxy 83, such as Resinfusion 8607 epoxy, is provided into the gaps between the blocks 54. If desired, sand, chopped glass or other filler materials may also be provided into the gaps between blocks 54 to strengthen the bond between the blocks 54 of the precursor body. Preferably, the epoxy 83 is poured to a level below the tops of the blocks 54 to allow the precursor section 31 or 35 to be attached to another precursor section. The support sheet 81 is then removed from the shaped precursor body. Alternatively, the precursor sections 31 and 35 may be shaped, such as by a water jet, into a larger body 15 of the desired shape, such as a cylindrical body, after being bound with epoxy 83. Furthermore, as described above, at least two layers of blocks for each section, such as section 31, may be adhered to each other prior to machining steps into a surface of the section.

Furthermore, if desired, release sheets may be attached to the exposed inside and outside surfaces of the sections 31 and/or 35 prior to pouring the epoxy 83. The release sheets are removed after pouring the epoxy 83 to expose bare surfaces of the blocks 54 of the sections 31 and/or 35 to allow each section to be adhered to another section. If desired, a glass/epoxy composite may be optionally would around the outside diameters of the section to 2-4 mm, preferably 3 mm for enhanced protection.

After the sections 31 and 35 are formed, they are attached to each other as shown in FIG. 4 by providing a layer of adhesive 52 between them. The adhesive layer may comprise epoxy with sand and/or glass or CA superglue. Preferably, the sections 31 and 35 are rotated 15 to 45 degrees, most preferably about 30 degrees with respect to each other, to interrupt continuous epoxy filled channels from propagating throughout the entire structure.

After forming the precursor body 15, the pocket 33 is filled with metal shims, such as iron or other metal shims. Preferably, the permanent-magnet body 15 and the shim dimensions are designed at the same time and the permanent magnet body 15 and the shims are formed based on this design. For example, the dimensions of the permanent magnet assembly may be adjusted to achieve the most easily shimmed permanent magnet body design.

When designing the shim and permanent magnet body dimensions, the capacity of the shim system given random perturbations of the design point are examined. The permanent magnet body shape and dimensions are then designed to optimize the $B_o$ field and the shimmability of the assembly, while taking into account temperature gradients during operation. A computer simulation may then be used to determine a range of inhomogeneity for each design point, to determine how to shim the perturbations to generate a shimmability score for each point and to fit a transfer function, and to optimize the design of the magnet assembly for shimmability.

Thus, a method of making a permanent magnet assembly includes forming at least two layers of blocks 54 of unmagnetized material and attaching the at least two layers of blocks to each other to form a base section 31 of a first precursor body 15, such that the thickness of the at least two layers of blocks is substantially perpendicular to the first 41 and the second 42 major surfaces of the base section. The second major surface 42 of the base section 31 is shaped to form at least three steps 21, 23, 25. The shaping may be performed before or after the at least two layers of blocks are attached to each other.

The hollow ring section 35 of the first precursor body 15 is formed from a plurality of blocks 54 of unmagnetized material. The hollow ring section 35 may be formed before, after or at the same time as the base section 31. The hollow ring section 35 is attached to the second major surface of the base section 42 to form the first precursor body 15. For example, the hollow ring section 15 may be attached by providing a layer of adhesive material on the second major surface 42 of the base section 31 and placing the hollow ring section 35 on the layer of adhesive material. The first precursor body 15 is then magnetized to convert it to the first permanent magnet body 15.

The method of making the permanent magnet assembly 11 and the MRI system 60 will now be described with respect to the fourth preferred embodiment of the present invention. A precursor body comprising a first unmagnetized material is attached to the support or yoke of the imaging apparatus prior to magnetizing the first unmagnetized material to form a first permanent magnet body. For example, the precursor body may be body 15 made up of sections 31 and 35 described above.

It is preferred to form the permanent magnet body according to the first and second preferred embodiments described above by magnetizing the unmagnetized precursor body prior to attaching this body to the imaging apparatus support. However, the permanent magnet body according to the first and second preferred embodiments may be magnetized before being attached to the support or yoke, if desired.

A method of making an imaging device, such as an MRI, MRT or NMR system, includes providing a support, attaching a first precursor body comprising a first unmagnetized material to the first support portion and magnetizing the first unmagnetized material to form a first permanent magnet body after attaching the first precursor body. Preferably, a second precursor body comprising the same or different unmagnetized material as the first material is attached to the second support portion and magnetized to form a second permanent magnet body after attaching the second precursor body.

The support preferably contains first portion, a second portion and at least one third portion connecting the first and the second portion such that an imaging volume is formed between the first and the second portions. For example, the support may comprise the yoke 61 of FIGS. 7, 8, 9 or 10 of the MRI system 60. The first and second precursor bodies may comprise any unmagnetized material that is suitable for use as a permanent magnet. Preferably the precursor bodies comprise an assembly of plurality of blocks of an RMB alloy, where R comprises at least one rare earth element and M comprises at least one transition metal, as described above.

If desired, at least one layer of soft magnetic material layer 13 described above is attached between the first and second precursor bodies of the unmagnetized material and the respective portion of the yoke prior to magnetizing the unmagnetized material of the precursor bodies. The soft magnetic material layer(s) 13 may be attached to the yoke prior to attaching the precursor bodies or the layer(s) 13 may be first attached to each precursor body 15, and subsequently both the layer(s) 13 and the precursor bodies 15 may be attached to the yoke.

The unmagnetized material of the precursor body may be magnetized by any desired magnetization method after the precursor body or bodies is/are attached to the yoke or support. For example, the preferred step of magnetizing the first precursor body comprises placing a coil around the first precursor body, applying a pulsed magnetic field to the first precursor body to convert the unmagnetized material of the first precursor body into at least one first permanent magnet body, and removing the coil from the first permanent magnet body. Likewise, the step of magnetizing the second precursor body, if such a body is present, comprises placing a coil around the second precursor body, applying a pulsed magnetic field to the second precursor body to convert the at least one unmagnetized material of the second precursor body to at least one permanent magnet body, and removing the coil from around the second permanent magnet body.

The same or different coils may be used to magnetize the first and second precursor bodies. For example, a first coil may be placed around the first precursor body and a second coil may be placed around the second precursor body. A pulsed current or voltage is applied to the coils simultaneously or sequentially to apply a pulsed magnetic field to the first and second precursor bodies. Alternatively, only one coil may be used to sequentially magnetize the first and second precursor bodies. The coil is first placed around the first precursor body and a magnetic field is applied to magnetize the first precursor body. Thereafter, the same coil is placed around the second precursor body and a magnetic field is applied to magnetize the second precursor body.

Figure 11:
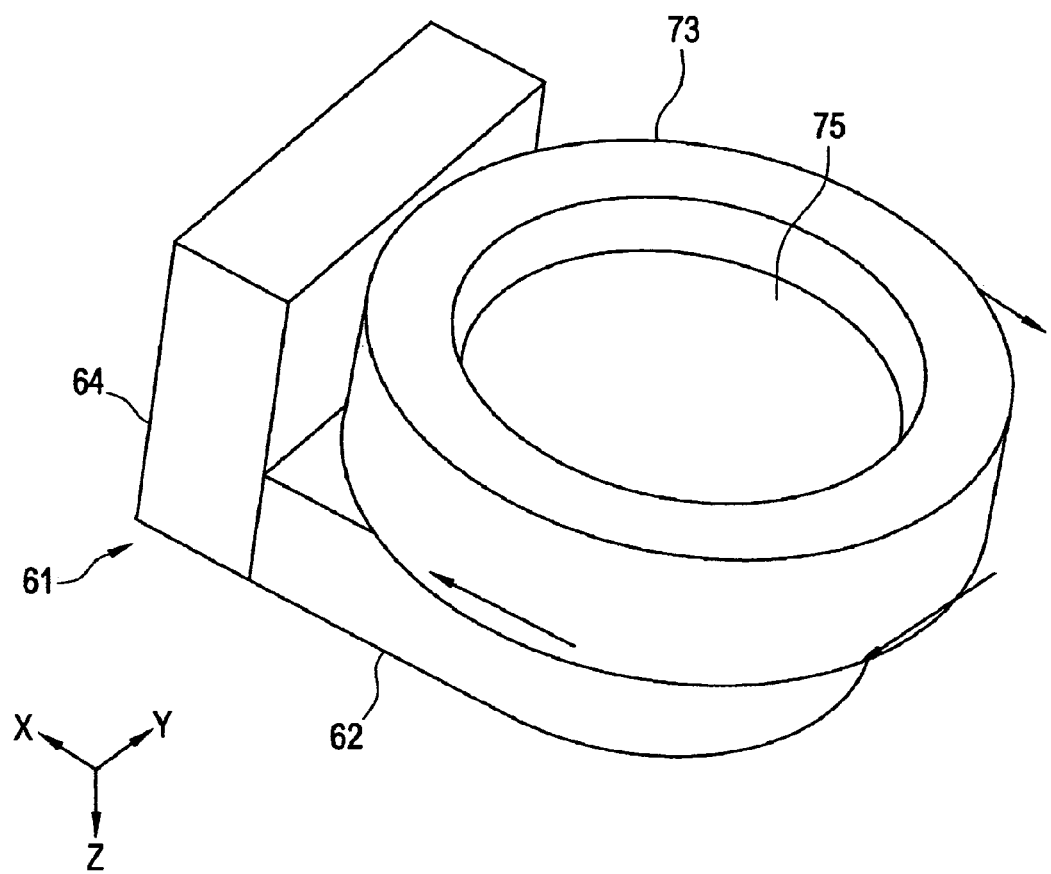
FIG. 11 is a perspective view of a coil housing used to magnetize an unmagnetized material suitable for use as a permanent magnet.

Preferably, the coil that is placed around the precursor body is provided in a housing 73 that fits snugly around the precursor body 75 located on a portion 62 of the yoke 61, as shown in FIG. 11. For example, for a precursor body 75 having a cylindrical outer configuration, such as the body 15 shown in FIG. 4, the housing 73 comprises a hollow ring whose inner diameter is slightly larger than the outer diameter of the precursor body 75. The coil is located inside the walls of the housing 75.

Preferably, a cooling system is also provided in the housing 73 to improve the magnetization process. For example, the cooling system may comprise one or more a liquid nitrogen flow channels inside the walls of the housing 73. The liquid nitrogen is provided through the housing 73 during the magnetization step. Preferably, a magnetic field above 2.5 Tesla, most preferably above 3.0 Tesla, is provided by the coil to magnetize the unmagnetized material, such as the RMB alloy, of the precursor body or bodies.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. It is intended that the scope of the invention be defined by the claims appended hereto, and their equivalents.

What is claimed is:

1. A permanent magnet assembly for an imaging apparatus comprising a permanent magnet body having a first surface and a stepped second surface which is adapted to face an imaging volume of the imaging apparatus, wherein the stepped second surface contains at least four steps, the permanent magnet body comprising:

a cylindrical base section having a major first surface attached to the at least one layer of a soft magnetic material and a major second surface having at least three steps such that at least two of the steps in the second surface of the base section are machined into the second surface of the base section, wherein the second surface of the base section is opposite to the first surface of the base section, wherein the base section comprises at least two layers of permanent magnet blocks, and wherein the at least one layer of the soft magnetic material is attached to a substantially flat first surface of the permanent magnet body;

a hollow ring section attached to an outer portion of the second surface of the base section, wherein the first and second surfaces of the base section and the first and second surfaces of the hollow ring section are arranged substantially perpendicular to a direction of a magnetic field of the magnet assembly, wherein the stepped second surface of the permanent magnet body comprises the second surface of the hollow ring section and a portion of the second surface of the base section that is not covered by the ring section, and wherein the second surface of the ring section extends at least 0.05 meters above an outer step on the second surface of the base section to form a pocket.

2. The assembly of claim 1, wherein the permanent magnet body comprises a permanent magnet RMB material, where R comprises at least one rare earth element and M comprises at least one transition metal.

3. The assembly of claim 1, wherein:

the permanent magnet RMB material comprises 13-19 atomic percent R, 4-20 atomic percent B and the balance M, where R comprises 50 atomic percent or greater Pr, 0.1-10 atomic percent of at least one of Ce, Y and La, and the balance Nd, and M comprises Fe; and the at least one layer of a soft magnetic material comprises a laminate of Fe-Si, Fe-Al, Fe-Co, Fe-Ni, Fe-Al-Si, Fe-Co-V, Fe-Cr-Ni or amorphous Fe- or Co-base alloy layers.

4. The assembly of claim 1, further comprising metal shims located in the pocket.

5. The assembly of claim 1, wherein a height of the at least three steps in the base section is less than 0.03 meters.

6. A permanent magnet assembly for an imaging apparatus comprising a permanent magnet body having a first surface and a stepped second surface which is adapted to face an imaging volume of the imaging apparatus, wherein the stepped second surface contains at least four steps, wherein a movable permanent magnet body is movable with respect to the second surface of permanent magnet body.

7. The assembly of claim 6, wherein a central step of the stepped second surface comprises a protrusion.

8. A permanent magnet assembly for an imaging apparatus comprising a permanent magnet body having a first surface and a stepped second surface which is adapted to face an imaging volume of the imaging apparatus, wherein a central step of the stepped second surface comprises a protrusion, the permanent magnet body comprising:

a cylindrical base section having a major first surface attached to the at least one layer of a soft magnetic material and a major second surface having at least three steps such that at least two of the steps in the second surface of the base section are machined into the second surface of the base section, wherein the second surface of the base section is opposite to the first surface of the base section, wherein the base section comprises at least two layers of permanent magnet blocks, and wherein the at least one layer of the soft magnetic material is attached to a substantially flat first surface of the permanent magnet body;

a hollow ring section attached to an outer portion of the second surface of the base section, wherein the first and second surfaces of the base section and the first and second surfaces of the hollow ring section are arranged substantially perpendicular to a direction of a magnetic field of the magnet assembly, wherein the stepped second surface of the permanent magnet body comprises the second surface of the hollow ring section and a portion of the second surface of the base section that is not covered by the ring section, and wherein:

the second surface of the ring section extends at least 0.05 meters above an outer step on the second surface of the base section to form a pocket; and a height of the at least three steps in the base section is less than 0.03 meters.

9. The assembly of claim 8, wherein:

the permanent magnet body comprises a permanent magnet RMB material, where R comprises at least one rare earth element and M comprises at least one transition metal;

the permanent magnet RMB material comprises 13-19 atomic percent R, 4-20 atomic percent B and the balance M, where R comprises 50 atomic percent or greater Pr, 0.1-10 atomic percent of at least one of Ce, Y and La, and the balance Nd, and M comprises Fe; and the at least one layer of a soft magnetic material comprises a laminate of Fe-Si, Fe-Al, Fe-Co, Fe-Ni, Fe-Al-Si, Fe-Co-V, Fe-Cr-Ni or amorphous Fe- or Co-base alloy layers.

10. The assembly of claim 8, further comprising metal shims located in the pocket.

11. The assembly of claim 8, wherein:

the stepped second surface comprises a plurality of rings;

the central step comprises a solid central ring;

outer steps comprise a plurality of hollow rings; and the solid central ring has a height that is greater than a height of a first hollow ring adjacent to the solid central ring, but less than a height of other plurality of hollow rings.

12. A permanent magnet assembly for an imaging apparatus comprising a permanent magnet body having a first surface and a stepped second surface which is adapted to face an imaging volume of the imaging apparatus, wherein a central step of the stepped second surface comprises a protrusion, and wherein a movable permanent magnet body is movable with respect to the second surface of the permanent magnet body.

13. The assembly of claim 12, wherein the movable permanent magnet body is located in an opening extending from the first surface of the permanent magnet body partially through the permanent magnet body.

* * * * *

UNITED STATES PATENT AND TRADEMARK OFFICE
CERTIFICATE OF CORRECTION

| | | |
|---|---|---|
| PATENT NO. | : 7,423,431 B2 | Page 1 of 1 |
| APPLICATION NO. | : 10/672658 | |
| DATED | : September 9, 2008 | |
| INVENTOR(S) | : Amm et al. | |

It is certified that error appears in the above-identified patent and that said Letters Patent is hereby corrected as shown below:

In Column 3, Line 44, delete "49" and insert -- 19 --, therefor.

Signed and Sealed this

Twenty-fourth Day of August, 2010

David J. Kappos
*Director of the United States Patent and Trademark Office*